United States Patent [19]
Ishizuka et al.

[11] Patent Number: 6,087,614
[45] Date of Patent: Jul. 11, 2000

[54] PLASMA TREATING DEVICE

[75] Inventors: Shuichi Ishizuka, Shiroyamamachi; Risa Nakase, Sagamihara; Takeshi Aoki, Hachioji, all of Japan

[73] Assignee: Tokyo Electron Limited, Tokyo-To, Japan

[21] Appl. No.: 09/101,668

[22] PCT Filed: Nov. 20, 1997

[86] PCT No.: PCT/JP97/04225

§ 371 Date: Oct. 29, 1998

§ 102(e) Date: Oct. 29, 1998

[87] PCT Pub. No.: WO98/22977

PCT Pub. Date: May 28, 1998

[30] Foreign Application Priority Data

Nov. 20, 1996 [JP] Japan .................................. 8-324559

[51] Int. Cl.[7] .................................................. B23K 9/00
[52] U.S. Cl. ........................... 219/121.43; 219/723 MR
[58] Field of Search ........................ 219/121.43, 121.41; 118/723 MR; 156/348; 204/192.12; 216/69

[56] References Cited

U.S. PATENT DOCUMENTS

| | | | |
|---|---|---|---|
| 4,401,054 | 8/1983 | Matsuo et al. | 118/723 MR |
| 4,492,620 | 1/1985 | Matsuo et al. | 204/192.12 |
| 4,960,073 | 10/1990 | Suzuki et al. | 118/723 MR |
| 5,234,526 | 8/1993 | Chen et al. | 156/345 |
| 5,580,420 | 12/1996 | Watanabe et al. | 216/69 |
| 5,858,162 | 1/1999 | Kubota | 156/345 |

FOREIGN PATENT DOCUMENTS

| | | |
|---|---|---|
| 61-218134 | 9/1986 | Japan . |
| 62-43335 | 12/1987 | Japan . |
| 63-233549 | 9/1988 | Japan . |
| 1-97399 | 4/1989 | Japan . |
| 3-3380 | 1/1991 | Japan . |
| 4-247876 | 9/1992 | Japan . |
| 4-271122 | 9/1992 | Japan . |
| 6-53170 | 2/1994 | Japan . |
| 6-73567 | 3/1994 | Japan . |
| 6-163421 | 6/1994 | Japan . |
| 6-196421 | 7/1994 | Japan . |

OTHER PUBLICATIONS

S. Takeishi, et al., "Fluorocarbon Films Deposited by PECVD with High Thermal Resistance and Low Dielectric Constants", *DUMIC, Conference Paper*, Feb. 20–21, 1996, pp. 71–77.

H. Kudo, et al., "Characteristics of Plasma–CF films for Very Low-k Dielectrics", Fujitsu, Ltd. pp. 71–75.

W. Lee, et al., "Plasma Polymerization of Low Dielectric Constant Fluorocarbon Polymer by ECR", pp. 261–289.

(List continued on next page.)

*Primary Examiner*—Teresa Walberg
*Assistant Examiner*—Quang Van
*Attorney, Agent, or Firm*—Smith, Gambrell & Russell, LLP

[57] ABSTRACT

The invention is intended to produce a plasma of uniform density in a wide region and to achieve plasma processing of a surface of a wafer (W) highly uniformly. A transmission window (23) which transmits a microwave is held on an upper wall of a vacuum vessel (2) having a plasma chamber (21) and a film forming chamber (22), and a waveguide (4) for guiding the microwave of 2.45 GHz for propagation into the vacuum vessel (2) in a TM mode is joined to the outer surface of the transmission window (23). The waveguide (4) has a rectangular waveguide section (41) a cylindrical waveguide section (42) serving as a TM converter, and a conical waveguide section (43) having an exit end connected to the outer surface of the transmission window (23). The microwave is propagated in a TM mode into the vacuum vessel (2) and a magnetic field is created in the vacuum vessel (2). A plasma can be formed in uniform density in the plasma chamber (21) if the inside diameter (A) of the exit end of the conical waveguide section is in the range of 130 to 160 mm, so that the highly uniform plasma processing of the surface of a wafer (W) of, for example, 8 in. in diameter can be achieved.

12 Claims, 13 Drawing Sheets

OTHER PUBLICATIONS

K. Endo, et al., "Effect of Bias Addition on the Gap–Filling Properties of Fluorinated Amorphous Carbon Thin Films Grown by Helicon Wave Plasma Enhanced Chemical Vapor Deposition", *Extended Abstracts of 1996 International Conference on Solid State Devices and Materials,* 1996, pp. 818–820.

Ishida, et al., "Highly Uniform Magnetic Field Design and Microwave Propagation Study in ECR Etching System by Numerical Simulation", *Proceedings of Symposium on Dry Process,* Oct. 29–30, 1992, pp. 17–22.

Popoy, "Electron Cyclotron Resonance Plasmas Excited by Rectangular and Circular Microwave Modes", *Journal of Vacuum Science & Technology,* vol. 8, 2nd Series, May/Jun. 1990, pp. 2909–2912.

| φA | THICKNESS VARIATION RATIO | THICKNESS DISTRIBUTION |
|---|---|---|
| φ194 | 23.8 (%) |  |
| φ165 | 18.7 (%) |  |
| φ150 | 7.2 (%) |  |
| φ109 | 52.5 (%) |  |
| φ120 | 20.0 (%) |  |
| φ130 | 8.8 (%) |  |
| φ140 | 8.2 (%) |  |
| φ160 | 8.8 (%) |  |

| φB | THICKNESS VARIATION RATIO (30) | THICKNESS DISTRIBUTION | DEPOSITION RATE (Å/min) |
|---|---|---|---|
| φ175 | 43.9% | ⌒ | 3611 |
| φ190 | 12.2% | ⌒ | 3575 |
| φ200 | 20.6% | ⌒ | 3985 |
| φ215 | 21.0% | ⌒ | 3891 |

FIG. 10

| INSIDE DIAMETER OF THE HOLDING RING | DEPOSITION RATE (Å/min) | THICKNESS VARIATION RATIO (30 %) |
|---|---|---|
| φ190 | 3709 | 13.6 |
| φ184 | 3696 | 9.8 |
| φ182 | 3708 | 12.1 |
| φ180 | 3473 | 13.6 |

FIG. 11

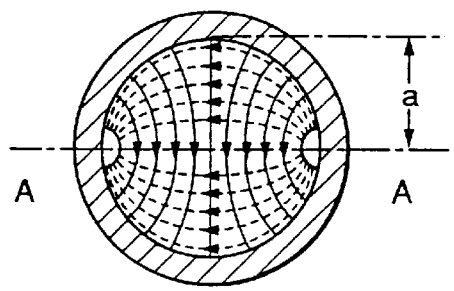
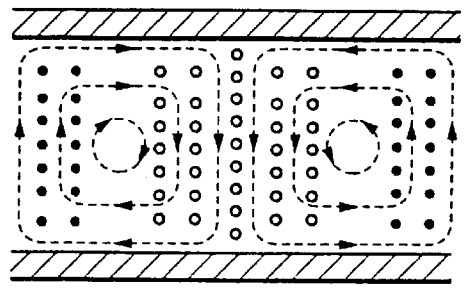
FIG. 14A          FIG. 14B
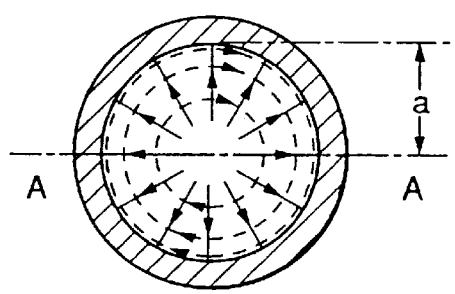
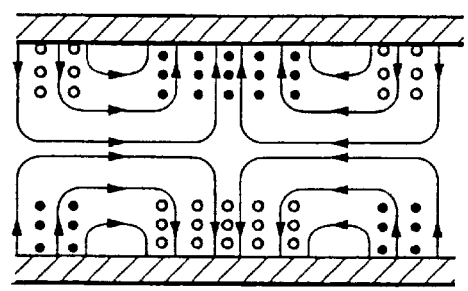
FIG. 15A          FIG. 15B

6,087,614

PLASMA TREATING DEVICE

TECHNICAL FIELD

The present invention relates to a plasma processing system for processing a object to be treated, such as a semiconductor wafer, with a plasma.

BACKGROUND ART

Most wiring patterns of integrated circuits are formed of aluminum wiring lines, and there is a tendency for methods of forming a layer insulating film, such as a $SiO_2$ film (silicon dioxide film) or a SiOF film (silicon oxide film containing fluorine), for insulating the aluminum wiring lines to employ an ECR (electron cyclotron resonance) plasma process because of the ability of the ECR plasma process to form films in a satisfactory quality.

Referring to FIG. 12 showing, by way of example, a conventional plasma processing system for carrying out the ECR plasma process, a 2.45 GHz microwave is propagated through a waveguide 11 into a plasma producing chamber 1A, a magnetic field of a predetermined magnetic field intensity, such as 875 G, is applied to the plasma producing chamber 1A by a solenoid 12 to produce a high-density plasma from a plasma producing gas 15, such as Ar gas and $O_2$ gas, by the interaction (resonance) of the microwave and the magnetic field, a reactive gas 16, such as $SiH_4$ gas or $SiF_4$ gas, supplied to a film forming chamber 1B is activated and ionized by the plasma, and a thin film is deposited on the surface of a semiconductor wafer W placed on a wafer stage 13.

As shown by way of example in FIG. 13, the waveguide 11 is formed by connecting a conical waveguide section 11b to the lower end of a rectangular waveguide section 11a having a bend therein for transmitting a transverse electric wave in a $TE_{11}$ mode (hereinafter referred to simply as "TE mode"). The lower end of the conical waveguide section 11b is joined to the upper end of a vessel defining the plasma producing chamber 1A. When a microwave is generated by a microwave generator 14 connected to the other end of the rectangular waveguide section 11a, the microwave is propagated in a TE mode in the waveguide 11 to the plasma producing chamber 1A. When the rectangular end of the bent rectangular waveguide section 11a is connected to the circular upper end of the conical waveguide section 11b, the microwave propagated in a TE mode in the rectangular waveguide section 11a is propagated also in a TE mode in the conical waveguide section 11b.

The propagation of the microwave in a TE mode in a cylindrical waveguide of an inside diameter 2a will be described with reference to FIGS. 14A and 14B. FIG. 14A is a cross-sectional view, and FIG. 14B is a sectional view taken on line A—A in FIG. 14A. In FIG. 14A, solid lines represent an electric field, and broken lines represent a magnetic field. In FIG. 14B, blank circles ○ indicate a direction of an electric field into the paper, and solid circles ● indicate a direction of an electric field out of the paper. In a TE mode, the electric field is parallel to the diameter of the conical waveguide, and $\lambda=3.41a$, where $\lambda$ is the wavelength of the microwave, and a is the radius of the cylindrical waveguide.

As is obvious from FIG. 14A, the density of lines of electric force is high in a central region and decreases toward a peripheral region if the microwave is guided in a TE mode into the plasma producing chamber 1A by the foregoing waveguide. Therefore the field intensity in the peripheral region is lower than that of the central region and hence the distribution of field intensity of the electric field is not uniform. Consequently, the density of a plasma produced by the agency of the microwave is low in the peripheral region and hence it is difficult to deposit a film on the surface of the wafer in a highly uniform thickness. Incidentally, the importance of the high uniformity of a film formed on the surface of a wafer has increased because pattern miniaturization has a tendency to advance in recent years.

A plasma processing system disclosed in U.S. Pat. No. 5,234,526 uses a $TM_{01}$ mode. This plasma processing system employs a waveguide formed by connecting one end of a rectangular waveguide section for propagating a microwave in a TE mode to one side of a cylindrical waveguide section of, for example, 109 mm in inside diameter to propagate a microwave in a $TM_{01}$ mode into a plasma producing chamber, and the lower end of the cylindrical waveguide section is joined to an upper end of a vessel defining the plasma producing chamber. In this waveguide, the joint of the rectangular waveguide section and the cylindrical waveguide section serves as a TM mode converter for converting wave propagation mode from a TE mode to a $TM_{01}$ mode.

Wave propagation in a $TM_{01}$ mode by the cylindrical waveguide of 2a in inside diameter will be described with reference to FIGS. 15A and 15B. FIG. 15A is a cross-sectional view, and FIG. 15B is a sectional view taken on line A—A in FIG. 15A. In a $TM_{01}$ mode, lines representing an electric field extends from the wall of the waveguide through a central region of the waveguide and to the wall of the waveguide, and the electric field changes its direction every half the wavelength as it is propagated, and $\lambda=2.61a$, where $\lambda$ is the wavelength of the microwave, and a is the inside radius of the cylindrical waveguide. In FIG. 15B, broken lines represented magnetic field, blank circles ○ indicate a direction of an electric field into the paper, and solid circles ● indicate a direction of an electric field out of the paper.

When processing a wafer of, for example, 6 in. in diameter by this plasma processing system, an electric field of a uniform field intensity can be created because the inside diameter of the cylindrical waveguide is 109 mm. However, there is a tendency in recent years for the diameter of wafers to increase. If a wafer has a diameter greater than the inside diameter of the cylindrical waveguide, field intensity in a region of the exit of the waveguide corresponding to the peripheral region of the wafer is reduced. Consequently, the density of the plasma in a region near the circumference of the wafer becomes smaller than that of the plasma in a region corresponding to the central part of the wafer, so that the distribution of the density of the plasma on the surface of the wafer becomes irregular and a film having a not satisfactorily uniform thickness is formed on the surface of the wafer.

The present invention has been made in view of such problems and it is therefore an object of the present invention to provide a plasma processing system capable of producing a plasma over a large area in a uniform plasma density and of uniformly plasma-processing the surface of a wafer of a big diameter.

DISCLOSURE OF THE INVENTION

According to a first aspect of the present invention, a plasma processing system, which produces a plasma from a gas by means of electron cyclotron resonance and uses the plasma for processing a object to be treated, comprises a vacuum vessel provided with a transmission window of a dielectric material to transmit a high-frequency wave, and a stage disposed therein to support a wafer; a magnetic field creating means for creating a magnetic field in the vacuum vessel; and a high-frequency wave providing means for providing in a transverse magnetic (TM) mode a high-frequency wave of 2.45 GHz for producing a plasma in the vacuum vessel; wherein the high-frequency wave providing means includes a conical waveguide section expanding toward the transmission window and having an exit end in contact with the outer surface of the transmission window, and the inside diameter of the exit end of the conical waveguide section is in the range of 130 to 160 mm.

According to a second aspect of the present invention, a plasma processing system, which produces a plasma from a gas by means of electron cyclotron resonance and uses the plasma for processing a object to be treated, comprises a vacuum vessel provided with a transmission window of a dielectric material to transmit a high-frequency wave, and a stage disposed therein to support a wafer; a magnetic field creating means for creating a magnetic field in the vacuum vessel; and a high-frequency wave providing means for providing in a TM mode a high-frequency wave for producing a plasma in the vacuum vessel; wherein the high-frequency wave providing means includes a conical waveguide section expanding toward the transmission window and having an exit end in contact with the outer surface of the transmission window, and an annular member of a conductive material is disposed at the exit end of the conical waveguide section so that its inner circumference lies inside the tapered surface of the conical waveguide section or an extension of the tapered surface of the conical waveguide section toward the vacuum vessel.

The vacuum vessel may have a plasma chamber in which a plasma is produced in its upper section, and a film forming chamber continuous with and formed under the plasma chamber. The dielectric material forming the transmission window may be aluminum nitride. The magnetic field creating means may be a solenoid. The magnetic field creating means may be a permanent magnet. The TM mode may be a $TM_{01}$ mode. The TM mode may be a higher mode. The process to which the object to be treated is subjected may be a film forming process or an etching process. The annular member of a conductive material may be disposed on the side of the conical waveguide section with respect to the transmission window. The annular member of a conductive material may be disposed on a side opposite the side of the conical waveguide section with respect to the transmission window. Desirably, the inside diameter of the annular member of a conductive material is in the range of 0.9A to A, where A is the inside diameter of the exit end of the conical waveguide section.

BRIEF DESCRIPTION OF THE DRAWINGS

FIG. 10 is a table showing the results of experiments conducted to validate the effect of the plasma processing system in the second embodiment;

FIG. 11 is a table showing the results of experiments conducted to validate the effect of the plasma processing system in the second embodiment;

FIGS. 14A and 14B are diagrammatic views of assistance in explaining a $TE_{11}$ mode; and FIGS. 15A and 15B are diagrammatic views of assistance in explaining a $TM_{01}$ mode.

PREFERRED EMBODIMENT FOR CARRYING OUT THE INVENTION

A plasma processing system in a first embodiment according to the present invention is designed to produce a plasma of a uniform density by forming the exit of a conical waveguide for propagating a high-frequency wave of 2.45 GHz (microwave) in an optimum diameter.

Figure 1:
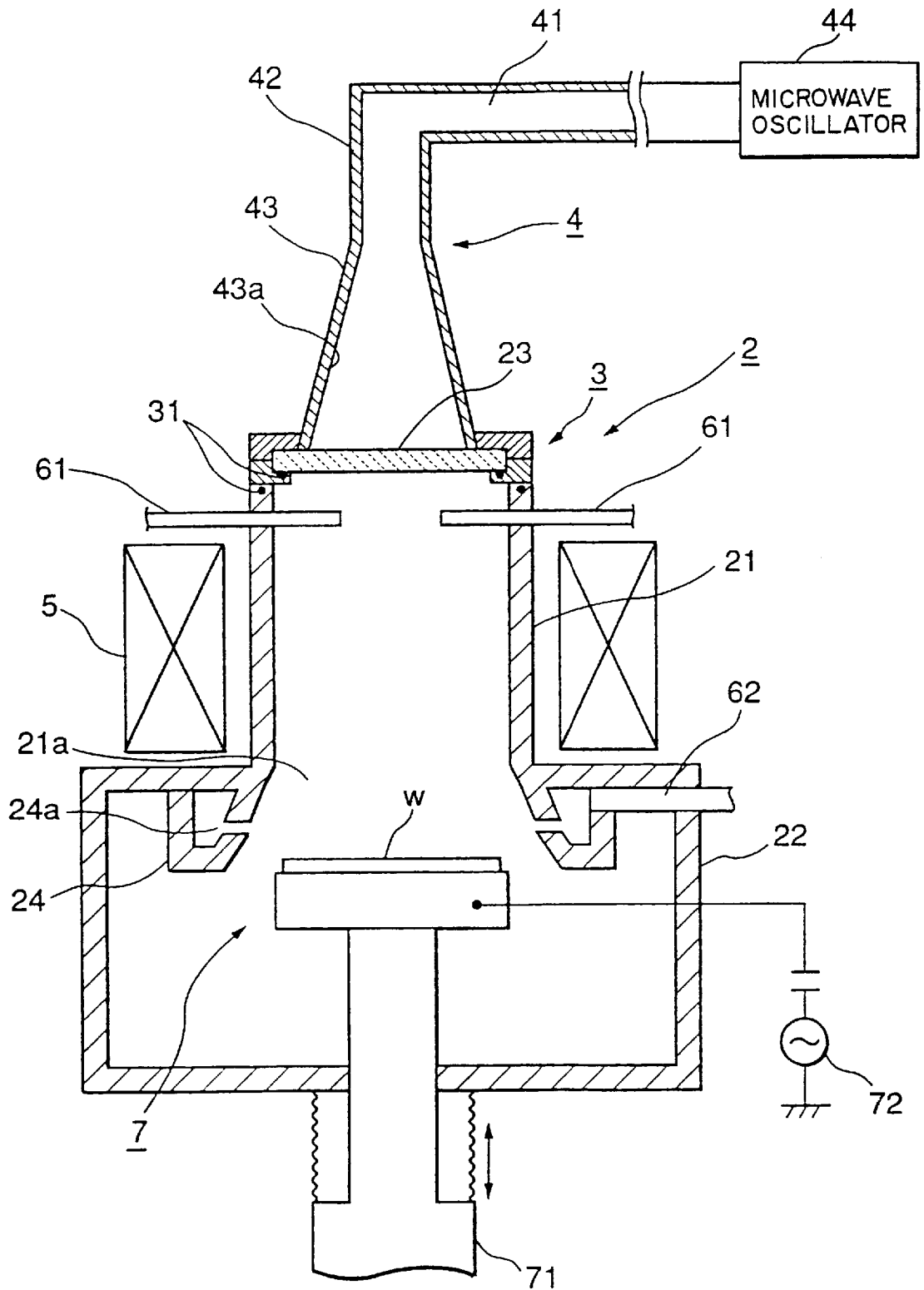
FIG. 1 is a sectional view of a plasma processing system in a first embodiment according to the present invention.

Referring to FIG. 1 showing the plasma processing system in the first embodiment, a vacuum vessel 2 made of aluminum or the like has a cylindrical plasma chamber 21 in its upper section, and a film forming cylindrical chamber 22 of an inside diameter greater than that of the plasma chamber 21 connected to the lower end of the plasma chamber 21.

A disk-shaped transmission window 23 to transmit the microwave is attached to the upper end of the vacuum vessel 2. The transmission window 23 is made of a dielectric material, such as aluminum nitride (AlN). The transmission window is held in an airtight fashion in a groove formed in the inner circumference of a holding ring 3 consisting of two sections, i.e., an upper section and a lower section. O rings 31 are interposed between the upper end of the side wall of the vacuum vessel 2 and the holding ring 3 and between the holding ring 3 and the transmission window 23, respectively, to maintain the interior of the vacuum vessel 2 in a vacuum state.

Figure 2:
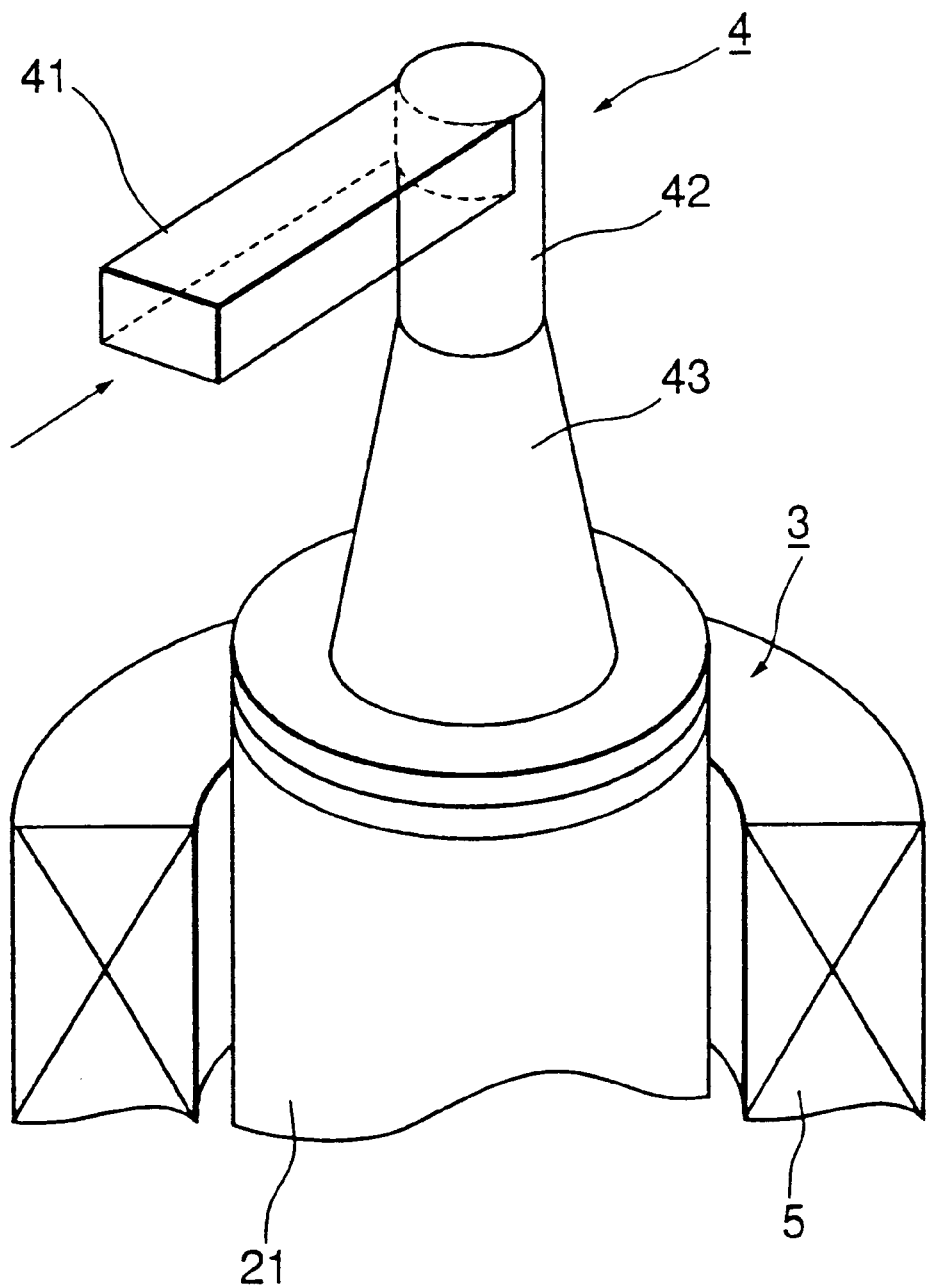
FIG. 2 is a perspective view of a waveguide employed in the plasma processing system in the first embodiment.

A waveguide 4 for propagating the microwave of 2.45 GHz in a TM mode, such as a $TM_{01}$ mode, is connected to the upper surface of the transmission window 23. As shown in FIG. 2, the waveguide 4 is constructed by connecting an exit end part of a rectangular waveguide section 41 to an upper end part of a cylindrical waveguide section 42 so as to extend perpendicularly to the cylindrical waveguide section 41, and connecting an exit end part (lower end part) of the cylindrical waveguide section 42 to an entrance end part (upper end part) of a conical waveguide section 43 expanding toward the lower end. The joint of the rectangular waveguide section 41 and the cylindrical waveguide section 42 serves as a TM mode converter. An entrance end part of the rectangular waveguide section 41 is connected to a microwave oscillator 44, namely, a high-frequency wave power supply. An exit end part (lower end part) of the conical waveguide section 43 is connected to the upper surface of the transmission window 23. In this embodiment, the rectangular waveguide section 41, the cylindrical waveguide section 42, the conical waveguide section 43 and the microwave oscillator 44 constitute a high-frequency wave propagating means.

Figure 3:
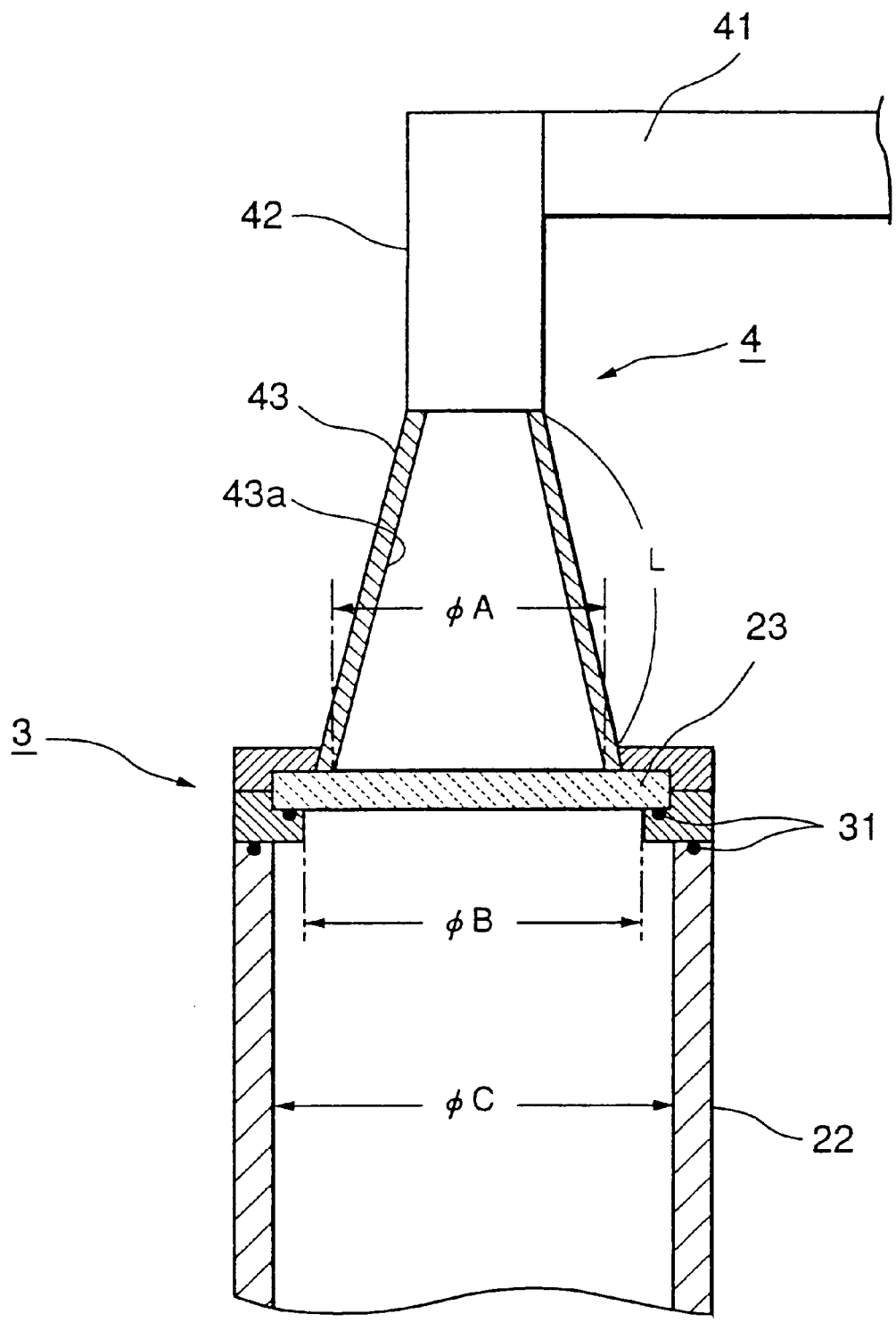
FIG. 3 is a sectional view of a waveguide employed in the plasma processing system in the first embodiment.

The cylindrical waveguide section 42 is 109 mm in inside diameter. As shown in FIG. 3, the length L of the conical waveguide section 43 must be greater than 120 mm corresponding to the wavelength of the microwave of 2.45 GHz to avoid disturbing the mode of the microwave during propagation. The length L of the conical waveguide section 43 is, for example, 245 mm. The inside diameter A (FIG. 3) of the exit end of the conical waveguide section 43 is, for example, in the range of 130 to 160 mm, which is determined on the basis of the results of experiments which will be described below.

The transmission window 23 is, for example, 10 mm in thickness and 200 mm in diameter. The inside diameter B of the holding ring 3 is determined so that the inner circumference of the lower section of the holding ring 3 on the side of the lower surface of the transmission window 23 lies outside an extension of a conical surface 43a of the conical waveguide section 43 toward the vacuum vessel 2 to prevent disturbing the electric field of the microwave by the interference of the holding ring 3 with the microwave. The diameter C of the plasma chamber 21 is, for example, 250 mm.

A solenoid 5, i.e., a magnetic field creating means, having, for example, an annular shape is disposed close to the outer circumference of a side wall defining the plasma chamber 21 so as to surround the plasma chamber 21. The solenoid 5 creates a downward magnetic field of 875 G in field intensity. The solenoid 5 may be substituted by a permanent magnet.

Plasma producing gas supply nozzles 61 are arranged at equal angular intervals on the side wall defining the plasma chamber 21. The plasma producing gas supply nozzles 61 are connected to gas sources, such as an Ar gas source and an $O_2$ gas source, not shown, to supply Ar gas and $O_2$ gas in a uniform distribution into the plasma chamber 21. Although only the two plasma producing gas supply nozzles 61 are shown in FIG. 1 for simplicity, the number of the plasma producing gas supply nozzles 61 is greater than two.

A source gas supply unit 24 provided with spouts 24a is disposed in the film forming chamber 22. A wafer stage 7 for supporting a semiconductor wafer W (hereinafter referred to simply as "wafer W") of, for example, 8 in. (200 mm) in diameter thereon is disposed in the film forming chamber 22. The wafer stage 7 is formed of, for example, aluminum, and is capable of being moved between a lower position in a lower region of the film forming chamber 22 and an upper position near the source gas supply unit 24 by, for example, a lifting mechanism 71 hermetically combined with the vacuum vessel 2. A biasing AC power supply 72 for applying a bias voltage to the wafer stage 7 is connected to the wafer stage 7 to attract ions of a plasma to the wafer W mounted on the wafer stage 7. A reactive gas supply pipe 62 is connected to the side wall of the film forming chamber 22 to supply a reactive gas, such as $SiH_4$ gas or $SiF_4$ gas into the source gas supply unit 24. A discharge port, not shown, is formed in the bottom wall of the vacuum vessel 2.

The operation of the plasma processing system will be described hereinafter as applied to forming a $SiO_2$ film or a SiOF film. The wafer stage 7 is lowered to a wafer receiving position, a wafer W is carried through a gate valve, not shown, onto the wafer stage 7 by a carrying arm, not shown, and then the wafer stage 7 supporting the wafer W is raised to a wafer processing position. Subsequently, the gate valve is closed to seal the vacuum vessel 2, the interior of the vacuum vessel 2 is evacuated through the discharge port, not shown, to a predetermined vacuum, plasma producing gases, such as Ar gas and $O_2$ gas, are supplied through the plasma producing gas supply nozzles 61 into the plasma chamber 21, $SiH_4$ gas or $SiF_4$ gas is supplied through the reactive gas supply pipe 62 into the film forming chamber 22 so that the pressure in the film forming chamber 22 is maintained at a predetermined process pressure, and the microwave oscillator 44 is actuated to transmit a microwave to the plasma chamber 21 to start a process of forming a $SiO_2$ film on the wafer W.

The 2.45 GHz microwave generated by the microwave oscillator 44 is guided by the rectangular waveguide section 41 for propagation in a TE mode, and the mode of propagation of the microwave is changed to a TM mode at the joint of the rectangular waveguide section 41 and the cylindrical waveguide section 42. The microwave is propagated in the TM mode through the conical waveguide section 43 to the upper end of the vacuum vessel 2, the microwave is transmitted by the transmission window 23 into the plasma chamber 21. The propagation of the microwave is not interfered with by the holding ring 3 and the microwave is propagated into the plasma chamber 21 without its electric field being disturbed. The magnetic field of 875 G in field intensity is applied to the plasma chamber 21 by the solenoid 5. The magnetic field and the microwave interacts to produce a high-density plasma of Ar gas and $O_2$ gas by the electron cyclotron resonance of the microwave with the magnetic field.

The plasma that flows from the plasma chamber 21 through an exit 21a into the film forming chamber 22 activates the reactive gas, such as $SiH_4$ or $SiF_4$ to produce active species, the active species are deposited on the surface of the wafer W to form a $SiO_2$ film or a SIOF film over the surface of the wafer W.

As mentioned above, the mode of propagation of the microwave guide for propagation by the waveguide 4 changes from a TE mode to a TM mode by the joint of the rectangular waveguide section 41 and the cylindrical waveguide section 42. The ratio of conversion of propagation mode from the TE mode to the TM mode is slightly smaller than 100%, for example, on the order of 98%. Although the present invention aims at a ratio of conversion of propagation mode of 100% as an ideal, a state of a TM mode slightly including a TE mode is regarded as a TM mode as stated in claims. As the microwave is propagated through the conical waveguide section 43 gradually expanding toward the plasma chamber 21, an electric field created by the microwave expands.

Figure 4A:
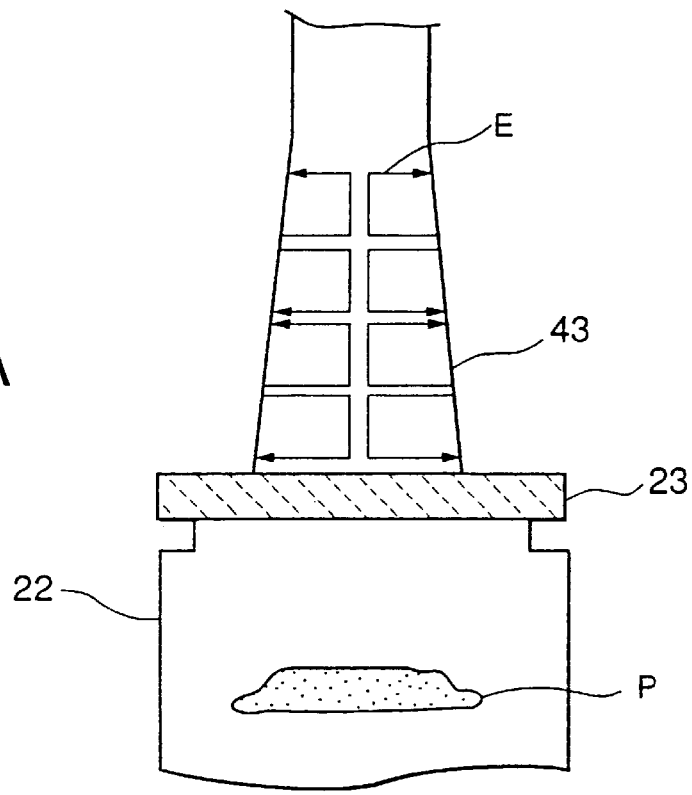
FIGS. 4A and 4B are views of assistance in explaining operations of the plasma processing apparatus in the first embodiment.
Figure 4B:
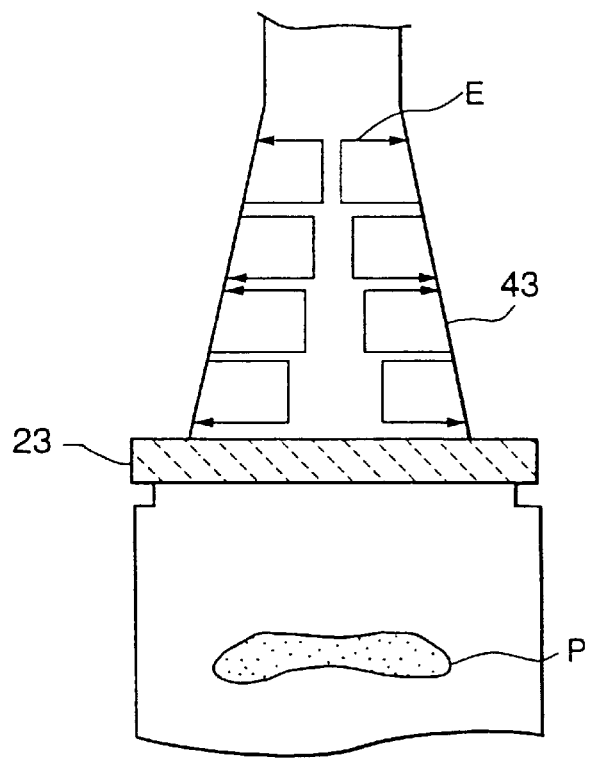

FIGS. 4A and 4B typically shows the propagation of the microwave guided by the conical waveguide section in the TM mode by the conical waveguide section 43 and the gradual expansion of the electric field created by the microwave. When the microwave is propagated in the TM mode, the electric field E is propagated along the wall of the conical waveguide section 43, changing its direction every half the wavelength, and the density of the lines of electric force in the center of the conical waveguide section 43 decreases toward the exit because the inside diameter of the conical waveguide section 43 increases toward the exit. Therefore, if the taper of the conical waveguide section 43 is small and the rate of increase of the inside diameter toward the exit is not very large, the density of the lines of electric force in the center does not decrease greatly toward the exit end and a plasma can be formed in a uniform density in a region corresponding to the section of the conical waveguide section 43. However, the density of the plasma in a region outside the region corresponding to the section of the conical waveguide section 43 is very smaller than that in the region corresponding to the section of the conical waveguide section 43 and a large plasma region P of a uniform plasma density cannot be formed.

If the inside diameter of the exit end of the conical waveguide section 43 is excessively big, the density of the lines of electric force in the center of the conical waveguide section 43 is small, i.e., the field intensity in the center of the conical waveguide section 43 is low. Consequently, a central part of a plasma region P formed in the plasma chamber 21 has a plasma density lower than that of a peripheral part of the plasma region P as shown in FIG. 4B, and a film is deposited in a central region of the surface of a wafer W at a deposition rate lower than that at which film is deposited in a peripheral region of the wafer W. Thus, a part of a $SiO_2$ film or a SiOF film formed on the surface of the wafer W corresponding to the central region of the surface of the wafer W is thin.

Thus, there is an upper limit to the inside diameter of the exit end of the conical waveguide section 43 and the inside diameter of the exit end of the conical waveguide section 43 should be neither excessively big not excessively small and must be within an optimum range to produce a plasma in a uniform plasma density in a wide area. If a microwave is guided by a waveguide for propagation in a TE mode by the conventional method, the lines of electric force extend diametrically. Therefore, the density of the lines of electric force in the center of the waveguide does not decreases even if the inside diameter of the exit end of the waveguide is increased and the irregularity of distribution of the lines of electric field in a section of the waveguide, if any, is increased, which is particularly different from microwave propagation in a TM mode.

The first embodiment of the present invention was designed on the basis of a fact that the uniformity of the density of the plasma is greatly dependent on the inside diameter of the exit end of the conical waveguide section 43 when the microwave is propagated in a TM mode, and it was found through the examination of data obtained through experiments, which will be described later, that an optimum value of the inside diameter A of the exit end of the conical waveguide section 43 is in the range of 130 to 160 mm.

Figure 5:
FIG. 5 is a table showing the results of experiments conducted to validate the effect of the plasma processing system in the first embodiment.
Figure 5:
Figure 5:
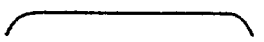
Figure 5:
Figure 5:
Figure 5:
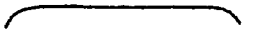
Figure 5:
Figure 5:

The experiments conducted by the inventors of the present invention using the plasma processing system shown in FIG. 1 will be explained hereinafter. The cylindrical waveguide section 42 was 109 mm in inside diameter, the transmission window 23 was 200 mm in diameter, the diameter C of the film forming chamber was 250 mm, the inside diameter A of the exit end of the conical waveguide section 43 was not greater than the inside diameter B of the holding ring 3. Ar gas and $O_2$ gas, namely, plasma producing gases, were supplied at 300 sccm and 200 sccm into the plasma chamber 21, respectively, $SiF_4$ gas, namely, a reactive gas, was supplied at 90 sccm into the film forming chamber 22. The power of the microwave was 2700 W, and the high-frequency bias power was 2500 W. A predetermined film forming process was carried out for different inside diameters A of the exit end of the conical waveguide section 43 to form films on 8 in. diameter wafers. The thicknesses of the films were measured at nine points on a diameter, and thickness variation ratios of the films were calculated. FIG. 5 shows thickness distributions in the films on a diameter of the wafers W determined on the basis of measured thicknesses of the films.

Figure 6:
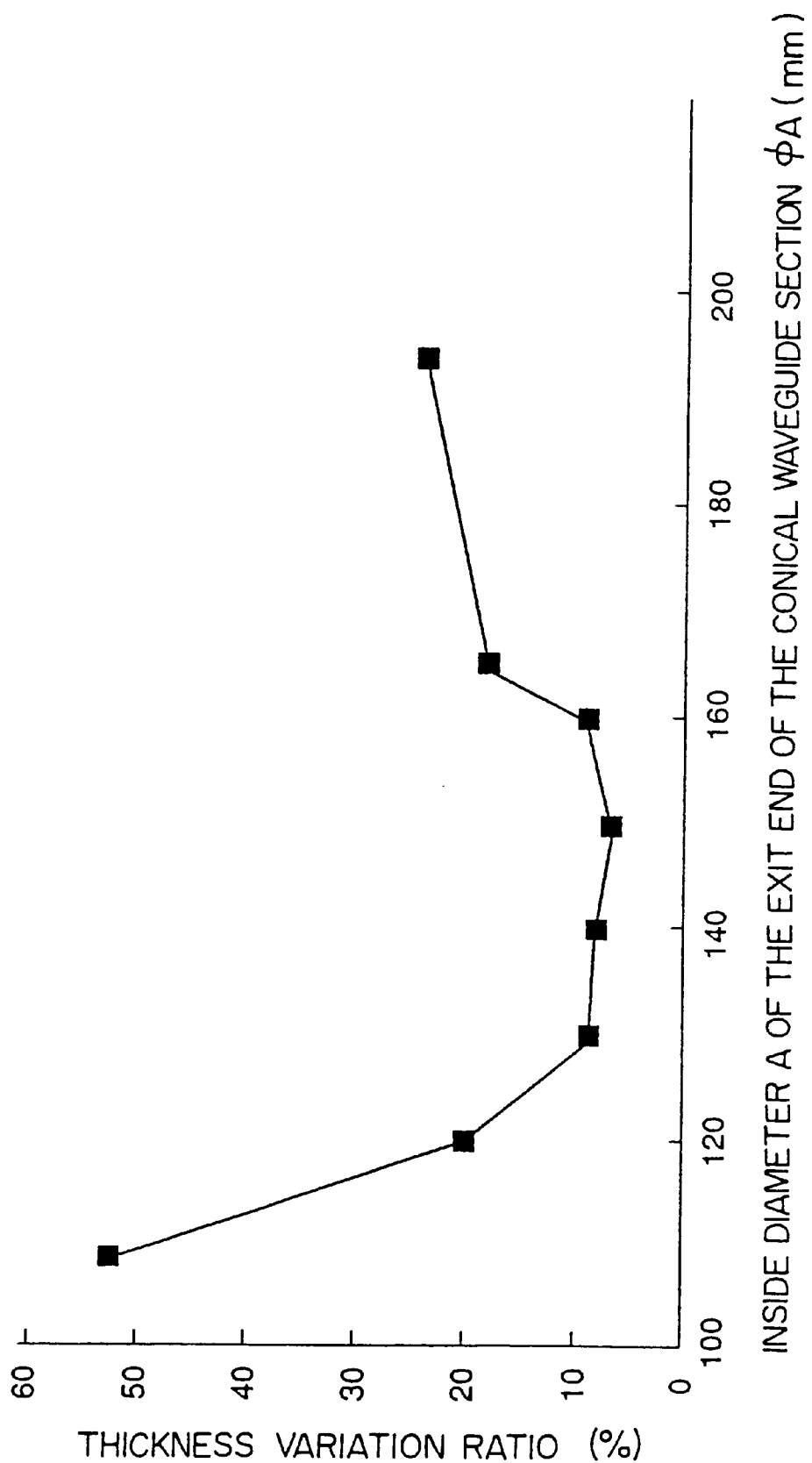
FIG. 6 is a graph showing the dependence of thickness variation ratio on the inside diameter A of the exit end of the conical waveguide determined through experiments conducted to validate the effect of the plasma processing system in the first embodiment.

As is obvious from FIGS. 5 and 6, the thickness of a peripheral part of the film was considerably small as compared with that of a central part of the film, and the thickness variation ratio was in the high range of 20 to 52.5% when the inside diameter A of the exit end was 109 mm or 120 mm. The thickness variation ratio was not greater than 8.8% and the thickness of the film was highly uniform when the inside diameter A of the exit end was in the range of 130 to 160 mm. The thickness variation ratio was 7.2% and the thickness of the film was particularly highly uniform when the inside diameter A of the exit end was 150 mm. The thickness of a central part of the film was extremely small as compared with that of a peripheral part of the film, and the thickness variation ratio was in the high range of 18.7 to 23.8% when the inside diameter A of the exit end was 165 or 194 mm.

Figure 7:
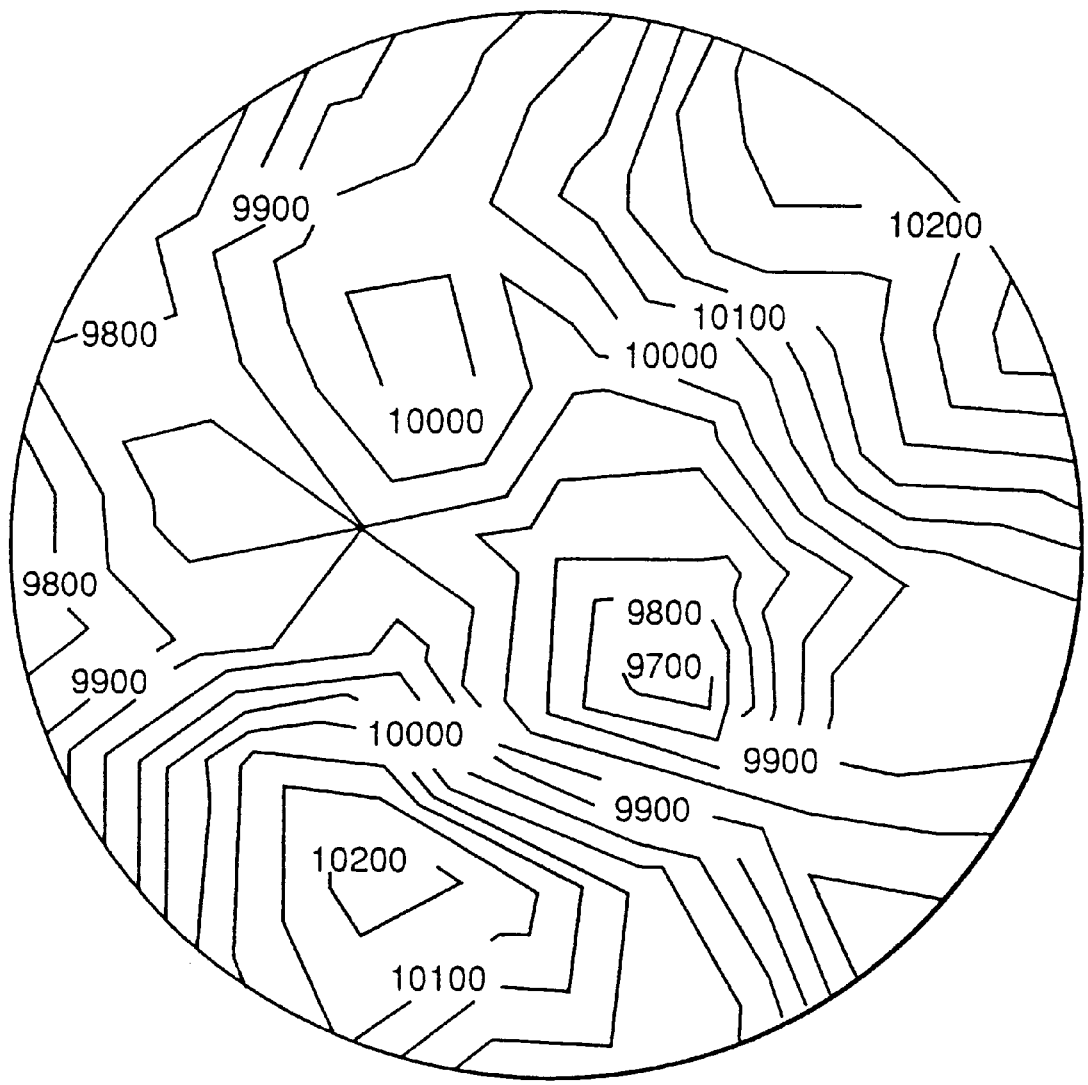
FIG. 7 is diagrammatic view showing a measured film thickness distribution obtained through experiments conducted to validate the effect of the plasma processing system in the first embodiment.

The results of experiments showed that the film can be formed in a satisfactory thickness variation ratio particularly when the inside diameter A of the exit end is 150 mm. Process conditions for plasma processing were optimized for the improvement of thickness variation ratio, and it was found that a film of 2.97% in thickness variation ratio could be formed at a deposition rate of 4445 Å/min when Ar gas was supplied at 350 sccm, $O_2$ gas was supplied at 200 sccm, $SiF_4$ gas was supplied at 140 sccm, the power of the microwave was 2.8 kW and the high-frequency power was 2.5 kW. FIG. 7 shows a thickness distribution in the film thus deposited, in which numerals indicate thicknesses in angstrom.

As is apparent from the foregoing description, the plasma processing system in the first embodiment propagates the microwave for producing a plasma in a TM mode and is provided with the conical waveguide section having an exit end of an optimum inside diameter. Therefore, the plasma processing system is capable of producing a plasma of a uniform density in a wide region, of plasma processing the surface of a wafer of a big diameter in a high surface uniformity and of forming a thin film on a wafer in an improved thickness uniformity. The cylindrical waveguide section 42 serving as a TM mode converter, and the conical waveguide section 43 serving as a means for expanding an electric field are combined, the mode of propagation of the microwave is converted into a TM mode at a high efficiency by the cylindrical waveguide section 42 of an inside diameter in the range of 109 to 120 mm, and the microwave is guide for propagation in a TM mode into the plasma chamber 21 by the conical waveguide section 43. Thus a TM mode can be created at a high efficiency, the electric field can be expanded and a plasma can be produced in a uniform density in a wide region.

If the microwave is propagated in a TM mode by using only the cylindrical waveguide section serving as a TM mode converter, the conical waveguide section is omitted, the inside diameter of the cylindrical waveguide section is greater than those in the range of 109 to 120 mm, the efficiency of TM mode creation is reduced. If the inside diameter of the cylindrical waveguide section is on the order of 150 mm, the efficiency of TM mode creation is low and a plasma cannot be produced in a uniform density in a wide region.

Figure 8:
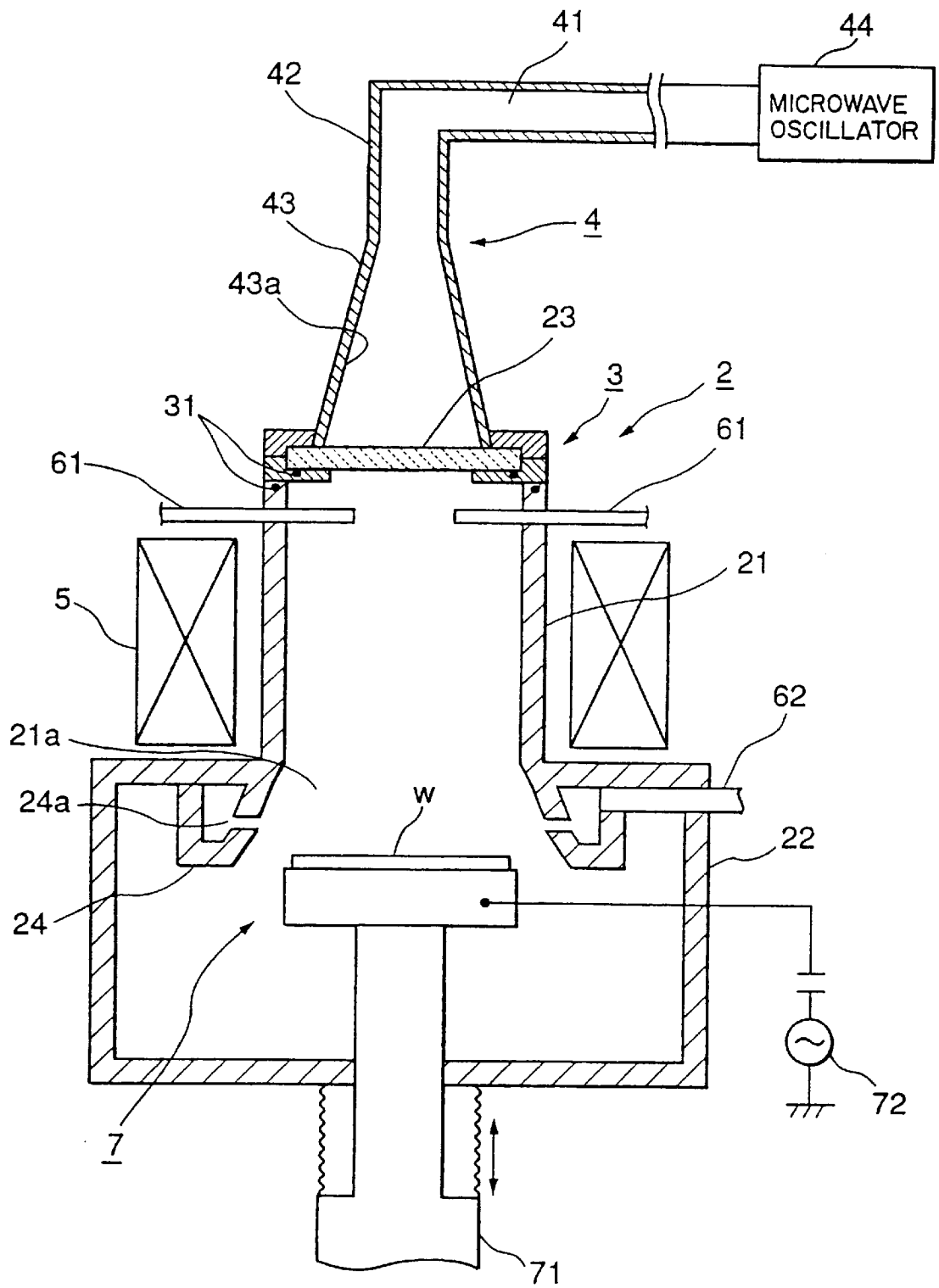
FIG. 8 is a sectional view of a plasma processing system in a second embodiment according to the present invention.
Figure 9A:
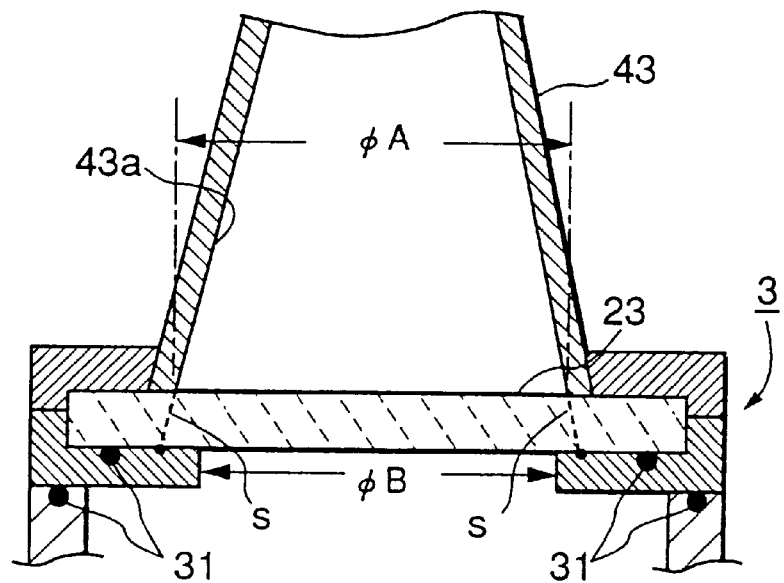
FIGS. 9A and 9B are fragmentary sectional views of the plasma processing system in the second embodiment.

A plasma processing system in a second embodiment according to the present invention will be described with reference to FIGS. 8, 9A and 9B. The plasma processing system in the second embodiment is suitable, in particular, when the inside diameter A of a conical waveguide section 43 is greater than 160 mm, which is the upper limit of the inside diameter A of the exit end of the conical waveguide section 43 of the first embodiment. A lower section of a holding ring 3, on the side of the lower surface of a transmission window 23 is intended to disturb a microwave to produce a plasma of a uniform density in a wide region.

The plasma processing system in the second embodiment differs from that in the first embodiment in that the inside diameter A of the exit end of the conical waveguide section 43 is, for example, 194 mm, the inner circumference of the lower section of the holding ring 3, on the side of the lower surface of the transmission window 23 lies inside a downward extension S indicated by broken lines of the taper surface 43a of the conical waveguide section 43.

The holding ring 3 is a conductive member made of a conductive material, such as Al (aluminum). The lower section of the holding ring 3 is formed so as to meet an inequality: A>B>0.9A, where A is the inside diameter of the exit end of the conical waveguide section 43 and B is the inside diameter of the lower section of the holding ring 3. When the inside diameter A is 194 mm, 180 mm≦B≦190 mm. The second embodiment is the same in other respects as the first embodiment.

The microwave is propagated along the wall of the conical waveguide section 43. Since the thickness on the order of 10 mm of the transmission window 23 of a dielectric material is far less than the wavelength of the microwave, the absorption of the microwave by the transmission window 23 of a dielectric material is negligibly small and the microwave is transmitted by the transmission window 23 substantially without being absorbed. Since the lower section made of a conductive material of the holding ring 3 protrudes into the passage of the microwave, the electric field created by the microwave is disturbed by the holding ring 3, causing resonance and reflection.

Since the inside diameter A of the exit end of the conical waveguide section 43 is as large as 194 mm, the field intensity of the electric field in a central region of the exit of the conical waveguide section 43 is lower than that in a peripheral region of the same. However, since the microwave is disturbed by an inner peripheral part of the lower section of the holding ring 3 on the side of the lower surface of the transmission window 23, the field intensity in the central region is affected by the resonance and reflection of the microwave and, consequently, the field intensity in the central region is enhanced. The second embodiment is designed on the basis of such a fact. The effect of the inside diameter B of the lower section of the holding ring 3 in disturbing the microwave was studied and it was found that an optimum value of the inside diameter B of the lower section of the holding ring 3 meets an inequality: A>B>0.9A, and is in the range of 180 to 190 mm when the inside diameter A is 194 mm.

Experiments conducted by the inventors of the present invention will be explained hereinafter. The plasma processing system shown in FIG. 1 was used. The cylindrical waveguide section 42 was 109 mm in inside diameter, the inside diameter A of the exit end of the conical waveguide section 43 was 194 mm, and the diameter C of the film forming chamber was 250 mm. Ar gas and $O_2$ gas, namely, plasma producing gases, were supplied at 200 sccm and 150 sccm into the plasma chamber 21, respectively, $SiF_4$ gas, namely, a reactive gas, was supplied at 79 sccm into the film forming chamber 22. The power of the microwave was 2000 W, and any high-frequency bias power was not used. A predetermined film forming process was carried out for different inside diameters B of the lower section of the holding ring 3 to form films on 8 in. diameter wafers W and deposition rate was measured. The thicknesses of the films were measured at nine points on a diameter of the wafers W, and thickness variation ratios of the films were calculated. FIG. 10 shows thickness distributions in the films on a diameter of the wafers W determined on the basis of measured thicknesses of the films.

It was found through the experiments that the thickens of the film increases sharply in a central part of the film and the thickness variation ratio is as large as 43.9% when the inside diameter B of the lower section of the holding ring 3 is as small as 175 mm, the thickness of the film decreases sharply in a central part of the film and the thickness variation ratio is not lower than 20.6% when the inside diameter B is not smaller than 200 mm, and the film has a substantially uniform thickness and the thickness variation ratio is as low as 12.2% when the inside diameter B is 190 mm as shown in FIG. 10.

If the inside diameter B is excessively big, a central region where the field intensity is low expands excessively and the field intensity in the central region is reduced greatly and, consequently, the density of the plasma in the central region decreases because the reduction of the field intensity in the central region cannot be compensated by the resonance and reflection of the microwave in the peripheral region. If the inside diameter B is excessively small, the central region in which the field intensity is low is narrow, the field intensity in the central region is not reduced greatly and, consequently, the density of the plasma in the central region is increased because the effect of the resonance and reflection of the microwave in the peripheral region on the increase of the field intensity in the central region is excessively high.

Process conditions for plasma processing were optimized to find an optimum value for the inside diameter B. A predetermined film forming process was carried out, in which Ar gas and $O_2$ gas, namely, plasma producing gases, were supplied at 300 sccm and 200 sccm, respectively, $SiF_4$ gas, i.e., a reactive gas, was supplied at 90 sccm, a microwave of 2700 W in power was used, the inside diameter B of the holding ring 3 was varied in the range of 180 to 190 mm and any high-frequency bias power was not used. Films were formed on 8 in. diameter wafers W. Deposition rate was measured during the film forming process, and thickness variation ratios were calculated. Other process conditions were similar to those of the foregoing film forming experiments.

As shown in FIG. 11, films of substantially uniform thickness were formed and the thickness variation was in the range of 9.8 to 13.6% indicating high uniformity of the thickness of the films when the holding ring 3 of an inside diameter B in the range of 180 to 190 mm was employed. It is found from the results of experiments that an optimum value of the inside diameter B of the holding ring 3 meet an inequality: 0.9A<B<A, where A is the inside diameter of the exit end of the conical waveguide section 43.

In the second embodiment, the relatively low field intensity in the central region can be enhanced by disturbing the electric field created by the microwave in the peripheral region by the holding ring 3 even if the inside diameter A of the exit end of the conical waveguide section 43 is 160 mm or above. Therefore a plasma can be produced in a uniform density in a considerably large region. Accordingly, the surface of the wafer can be uniformly processed by the plasma process by forming the chambers in optimum shapes and a film of uniform thickness can be formed on the wafer even if the diameter of the wafer is 12 in. or above.

Figure 9B:
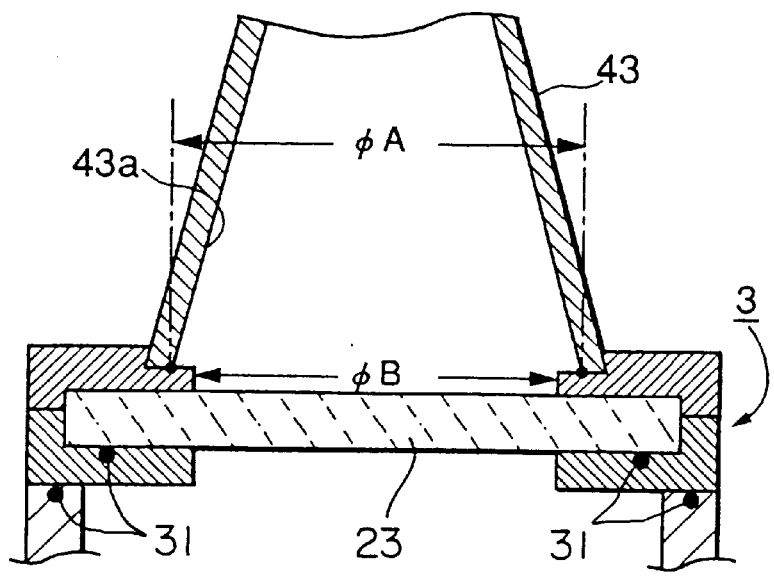
Figure 12:
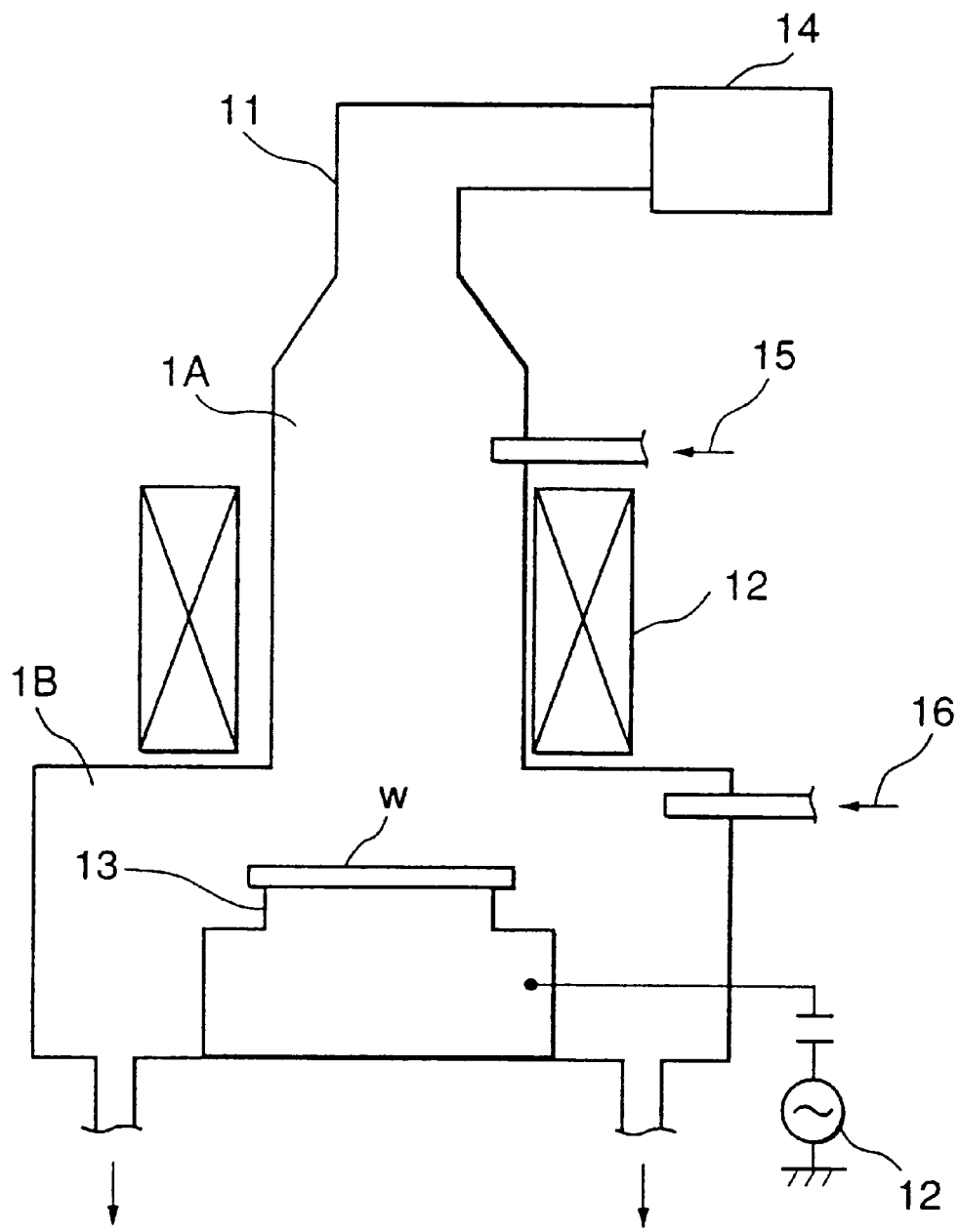
FIG. 12 is a sectional view of a conventional plasma processing system.
Figure 13:
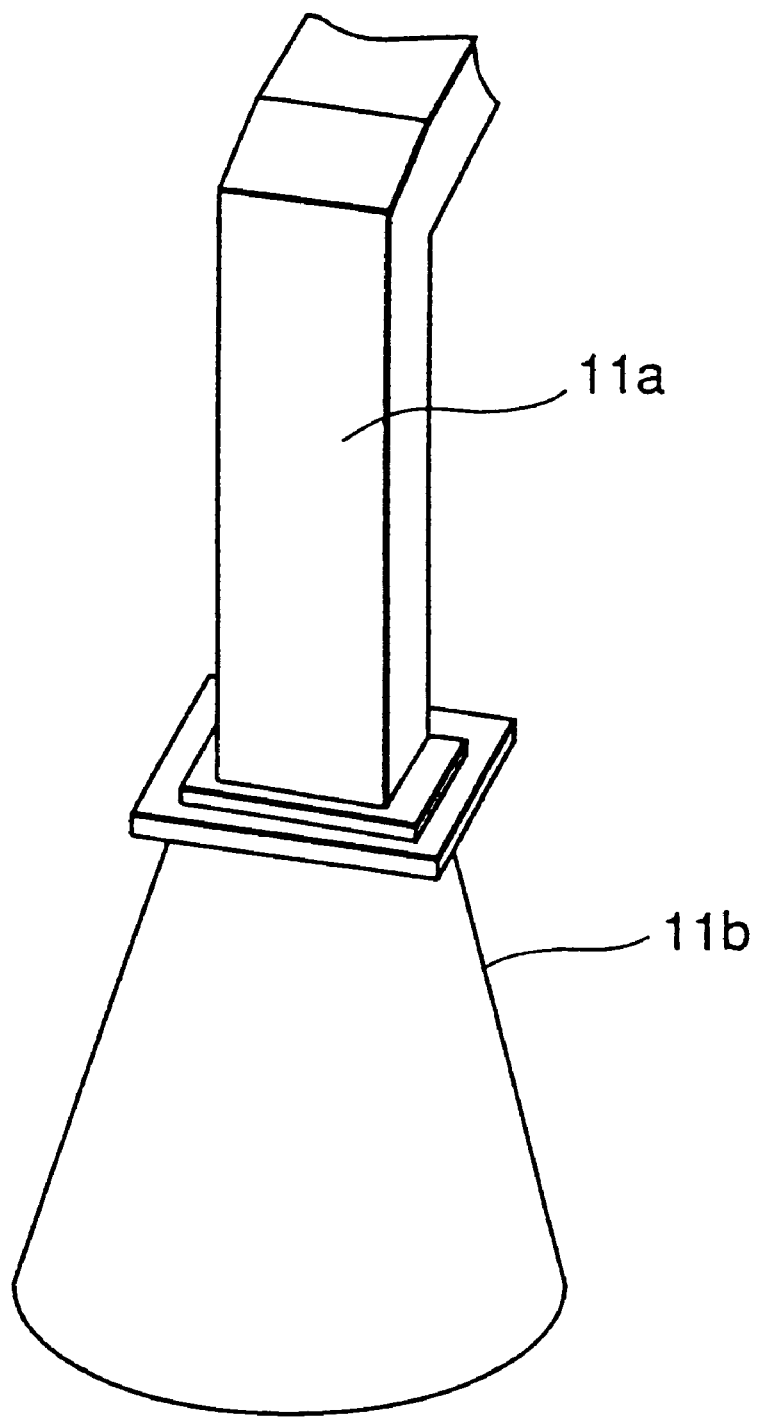
FIG. 13 is a perspective view of a waveguide employed in the conventional plasma processing system.

In the second embodiment, it is also possible to form the upper section of the holding ring 3 on the side of the upper surface of the transmission window 23 so as to protrude inside the taper surface 43a of the conical waveguide section 43 as shown in FIG. 9B to disturb the electric field created by the microwave by the upper section of the holding ring 3 on the side of the upper surface of the transmission window 23 for resonance and reflection.

In the foregoing embodiments, higher TM mode may be used instead of a $TM_{01}$ mode. The present invention is applicable not only to a film forming process, but also to other processes, such as an etching process. In the second embodiment, the inside diameter A of the exit end of the conical waveguide section may be 160 mm or below.

According to the present invention, a plasma can be produced in a wide region in a uniform density, and the surfaces of wafers of a big diameter can be uniformly processed by a plasma process.

What is claimed is:

1. A plasma processing system, which produces a plasma from a gas by means of electron cyclotron resonance and uses the plasma for processing a object to be treated, said plasma processing system comprising:

a vacuum vessel provided with a transmission window of a dielectric material to transmit a high-frequency wave, and a stage disposed therein to support a wafer;

a magnetic field creating means for creating a magnetic field in the vacuum vessel; and a high-frequency wave providing means for providing in a transverse magnetic (TM) mode a high-frequency wave of 2.45 GHz for producing a plasma in the vacuum vessel;

wherein the high-frequency wave providing means includes a conical waveguide section expanding toward the transmission window and having an exit end in contact with the outer surface of the transmission window, and the inside diameter of the exit end of the conical waveguide section is in the range of 130 to 160 mm.

2. A plasma processing system, which produces a plasma from a gas by means of electron cyclotron resonance and uses the plasma for processing an object to be treated, said plasma processing system comprising:

a vacuum vessel provided with a transmission window of a dielectric material to transmit a high-frequency wave, and a stage disposed therein to support a wafer;

a magnetic field creating means for creating a magnetic field in the vacuum vessel; and a high-frequency wave providing means for providing in a transverse magnetic (TM) mode a high-frequency wave for producing a plasma in the vacuum vessel;

wherein the high-frequency wave providing means includes a conical waveguide section expanding toward the transmission window and having an exit end in contact with the outer surface of the transmission window, and an annular member of a conductive material is disposed at an exit end of the conical waveguide section so that its inner circumference lies inside the tapered surface of the conical waveguide section or an extension of the tapered surface of the conical waveguide section toward the vacuum vessel, an inside diameter of the annular member of a conductive material being in the range of 0.9A to A, where A is an inside diameter of the exit end of the conical waveguide section.

3. The plasma processing system according to claim 1 or 2, wherein the vacuum vessel has a plasma chamber in which a plasma is produced in its upper section, and a film forming chamber continuous with and formed under the plasma chamber.

4. The plasma processing system according to claim 1 or 2, wherein the dielectric material forming the transmission window is aluminum nitride.

5. The plasma processing system according to claim 1 or 2, wherein the magnetic field creating means is a solenoid.

6. The plasma processing system according to claim 1 or 2, wherein the magnetic field creating means is a permanent magnet.

7. The plasma processing system according to claim 1 or 2, wherein the TM mode is a $TM_{01}$ mode.

8. The plasma processing system according to claim 1 or 2, wherein the TM mode is a higher mode.

9. The plasma processing system according to claim 1 or 2, wherein the process to which the object to be treated is subjected is a film forming process.

10. The plasma processing system according to claim 1 or 2, wherein the process to which the object to be treated is subjected is an etching process.

11. The plasma processing system according to claim 2, wherein the annular member of a conductive material is disposed on the side of the conical waveguide section with respect to the transmission window.

12. The plasma processing system according to claim 2, wherein the annular member of a conductive material is disposed on a side opposite to the side of the conical waveguide section with respect to the transmission window.

* * * * *